(12) United States Patent
Joo (10) Patent No.: US 9,454,999 B2
(45) Date of Patent: Sep. 27, 2016

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Han Soo Joo, Chungcheongbuk-do (KR)

(73) Assignee: SK hynix Inc., Icheon-si (KR)

( * ) Notice: Subject to any disclaimer, the term of this patent is extended or adjusted under 35 U.S.C. 154(b) by 55 days.

(21) Appl. No.: 14/552,951

(22) Filed: Nov. 25, 2014

(65) Prior Publication Data

US 2015/0078107 A1    Mar. 19, 2015

Related U.S. Application Data

(62) Division of application No. 13/716,454, filed on Dec. 17, 2012, now Pat. No. 8,923,059.

(30) Foreign Application Priority Data

Aug. 29, 2012   (KR) ......................... 10-2012-0095074

(51) Int. Cl.

| G11C 11/34 | (2006.01) |
|---|---|
| G11C 7/00 | (2006.01) |
| G11C 16/10 | (2006.01) |
| G11C 16/04 | (2006.01) |
| G11C 16/34 | (2006.01) |
| H01L 29/792 | (2006.01) |
| H01L 27/115 | (2006.01) |

(52) U.S. Cl.
CPC .............. *G11C 7/00* (2013.01); *G11C 16/0483* (2013.01); *G11C 16/10* (2013.01); *G11C 16/3427* (2013.01); *H01L 27/11582* (2013.01); *H01L 29/7926* (2013.01); *G11C 16/107* (2013.01)

(58) Field of Classification Search
CPC ..... G11C 7/00; G11C 16/10; G11C 16/0483; G11C 16/3427; H01L 29/792
USPC ............ 365/185.24, 185.25, 185.17, 185.18, 365/185.27
See application file for complete search history.

(56) References Cited

U.S. PATENT DOCUMENTS

| 5,844,270 | A | 12/1998 | Kim et al. |
|---|---|---|---|
| 5,977,584 | A | 11/1999 | Kim |
| 6,072,722 | A | 6/2000 | Hirano |
| 6,614,688 | B2 | 9/2003 | Jeong et al. |
| 7,180,787 | B2 * | 2/2007 | Hosono .................. G11C 16/08 365/185.02 |
| 7,212,439 | B2 * | 5/2007 | Park .................... G11C 16/0483 365/185.11 |
| 7,327,606 | B2 * | 2/2008 | Lee .................... G11C 16/3427 365/185.17 |
| 7,411,834 | B2 | 8/2008 | Kusakabe et al. |
| 7,696,559 | B2 | 4/2010 | Arai et al. |

(Continued)

FOREIGN PATENT DOCUMENTS

| KR | 1020110031068 A | 3/2011 |
|---|---|---|
| KR | 1020110094989 A | 8/2011 |

*Primary Examiner* — Viet Q Nguyen
(74) *Attorney, Agent, or Firm* — Haynes & Boone LLP (57) ABSTRACT

A semiconductor memory device is provided. The semiconductor memory device includes a memory cell array including cell strings coupled between bit lines and a common source line, each of the cell strings comprising a plurality of memory cells stacked above a substrate. The semiconductor memory device also includes a peripheral circuit configured to supply a negative voltage to one or more word lines coupled to the cell strings and supply a positive voltage to the common source line, wherein the peripheral circuit supplies the positive voltage and the negative voltage before a program operation is performed.

20 Claims, 11 Drawing Sheets (56) References Cited

U.S. PATENT DOCUMENTS

| | | | |
|---|---|---|---|
| 7,738,298 B2 | 6/2010 | Chae et al. | |
| 7,760,551 B2 | 7/2010 | Park et al. | |
| 7,764,544 B2 | 7/2010 | Mokhlesi | |
| 7,888,731 B2* | 2/2011 | Kim | H01L 27/11551 257/314 |
| 7,978,522 B2* | 7/2011 | Kang | G11C 11/5628 365/185.17 |
| 8,027,197 B2* | 9/2011 | Shim | G11C 5/02 365/185.05 |
| 8,036,043 B2* | 10/2011 | Oh | G11C 16/0483 365/185.03 |
| 8,199,581 B2 | 6/2012 | Kim | |
| 8,238,153 B2* | 8/2012 | Lee | G11C 16/0483 365/185.02 |
| 8,248,853 B2* | 8/2012 | Lee | G11C 11/5628 365/185.17 |
| 8,295,097 B2* | 10/2012 | Cho | G11C 16/0483 365/185.18 |
| 8,320,184 B2 | 11/2012 | Yang et al. | |
| 8,335,109 B2* | 12/2012 | Seol | G11C 11/5628 365/185.05 |
| 8,343,812 B2 | 1/2013 | Song et al. | |
| 8,437,199 B2 | 5/2013 | Park | |
| 8,456,918 B2* | 6/2013 | Oh | G11C 16/10 365/185.02 |
| 8,514,621 B2 | 8/2013 | Choi et al. | |
| 8,531,886 B2 | 9/2013 | Huang et al. | |
| 8,916,926 B2* | 12/2014 | Choe | H01L 27/1157 257/324 |
| 2014/0085978 A1 | 3/2014 | Lee | |

* cited by examiner

| Line | Voltage |
|---|---|
| BL | Vss |
| DSL | Vcc |
| DWL2 | Vn |
| MWL1~MWL4 | Vss |
| DWL1 | |
| SSL | |
| CSL | Vcc |

| Line | Voltage |
|---|---|
| BL | Vss |
| DSL | Vcc |
| DWL2 | Vn |
| WLG2 (MWL3, MWL4) | V3 |
| WLG1 (MWL1, MWL2) | V2 |
| DWL1 | V1 |
| SSL | |
| CSL | Vcc |

SEMICONDUCTOR MEMORY DEVICE AND METHOD OF OPERATING THE SAME

CROSS-REFERENCE TO RELATED APPLICATIONS

This application is a divisional of U.S. patent application Ser. No. 13/716,454, filed on Dec. 17, 2012, which claims priority from Korean Patent Application No. 10-2012-0095074, filed on Aug. 29, 2012, the contents of which are incorporated herein by reference in their entirety.

BACKGROUND

A semiconductor memory device is provided. A semiconductor memory is a memory device embodied by using a semiconductor such as silicon Si, germanium Ge, gallium arsenide GaAs, indium phosphide Inp, etc. Typically, a semiconductor memory device may be either a volatile memory device or a non-volatile memory device.

A volatile memory device is a memory device where stored data becomes lost if power is not supplied. Examples of volatile memory devices include a static RAM (SRAM), a dynamic RAM (DRAM), a synchronous DRAM (SDRAM) and so on. A non-volatile memory device is a memory device where stored data remains even when a power is not supplied. Examples of non-volatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), etc. Flash memory, which may be the most common and well-known non-volatile memory device, includes a NOR-type memory device and a NAND-type memory device.

Semiconductor memory devices having three-dimensional array structure have been studied to enhance integrity of the semiconductor memory device. In order to produce such devices, it is important to secure reliability of a program operation, a read operation and an erase operation.

BRIEF SUMMARY

Embodiments described herein may provide a semiconductor memory device having enhanced reliability.

Consistent with some embodiments, there is provided a method of operating a three-dimensional semiconductor memory device. The method includes supplying a negative voltage to one or more word lines coupled to cell strings coupled between bit lines and a common source line; and a positive voltage to the common source line to set channels of the cell strings, and performing a program operation to a selected area of the cell strings.

In some embodiments, word lines disposed between the word line to which the negative voltage may be supplied and the common source line are divided into word line groups, and voltages supplied to the word line groups may get higher according as a distance between a corresponding word line group and the source select line is small.

Consistent with some embodiments, there is also provided a method of operating a three-dimensional semiconductor memory device having cell strings coupled between bit lines and a common source line. The method includes driving row lines coupled to the cell strings so that a potential of a channel of each of the cell strings has substantially the same magnitude or decreases as a distance between the channel and the common source line becomes smaller, and performing a program operation to a selected area of the cell strings.

Consistent with some embodiments, there is also provided a semiconductor memory device. The semiconductor memory device includes a memory cell array including cell strings coupled between bit lines and a common source line, each of the cell strings comprising a plurality of memory cells stacked above a substrate. The semiconductor memory device also includes a peripheral circuit configured to supply a negative voltage to one or more word lines coupled to the cell strings and supply a positive voltage to the common source line, wherein the peripheral circuit supplies the positive voltage and the negative voltage before a program operation is performed.

The peripheral circuit may supply the negative voltage to a word line adjacent to the bit lines of the word lines.

Embodiments as disclosed herein may provide enhanced reliability.

BRIEF DESCRIPTION OF THE DRAWINGS

Embodiments consistent with this disclosure are described with reference to the following detailed description when considered in conjunction with the accompanying drawings wherein.

DETAILED DESCRIPTION

In the following description specific details are set forth describing certain embodiments. It will be apparent, however, to one skilled in the art that the disclosed embodiments may be practiced without some or all of these specific details. The specific embodiments presented are meant to be illustrative, but not limiting. One skilled in the art may realize other material that, although not specifically described herein, is within the scope and spirit of this disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Figure 1:
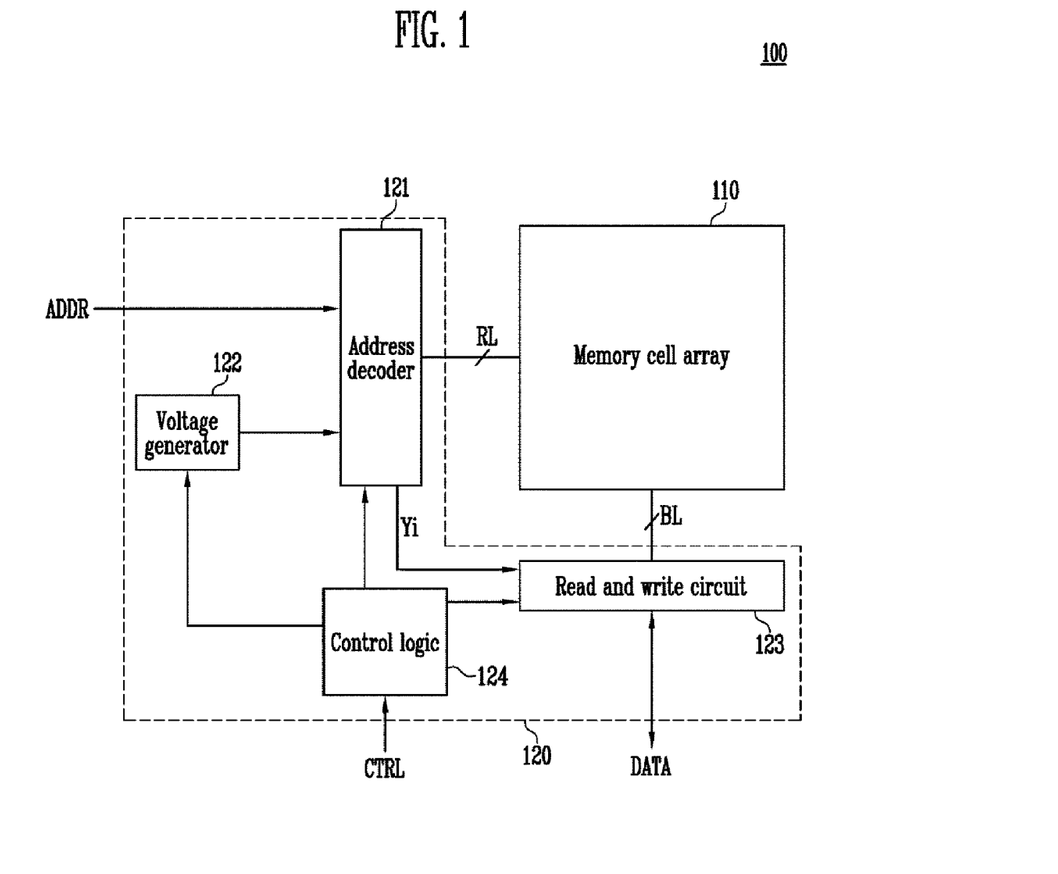
FIG. 1 is a block diagram illustrating a semiconductor memory device according to some embodiments.

FIG. 1 is a block diagram illustrating a semiconductor memory device according to some embodiments. As shown in FIG. 1, the semiconductor memory device 100 may include a memory cell array 110 and a peripheral circuit 120 for driving the memory cell array 110. The memory cell array 110 is coupled to an address decoder 121 through row lines RL. The memory cell array 110 is coupled to a read and write circuit 123 through bit lines BL. The memory cell array 110 includes memory blocks (not shown) that each include cell strings. Each of the cell strings includes memory cells stacked on a substrate. Consistent with some embodiments, the memory cells are non-volatile memory cells. Although for the purpose of this disclosure, memory cells as described herein will refer to single level memory cells, consistent with some embodiments, each of the memory cells may be a single level cell or a multi level cell. The memory cell array 110 will be described in detail with reference to accompanying drawings FIG. 2 to FIG. 7.

The peripheral circuit 120 includes the address decoder 121, a voltage generator 122, the read and write circuit 123 and a control logic 124, and drives the memory cell array 110. The address decoder 121 is coupled to the memory cell array 110 through the row lines RL. The row lines RL may include drain select lines, word lines, a source select line and a common source line. The address decoder 121 drives the row lines RL in response a controlling signal received from the control logic 124.

The address decoder 121 receives an address ADDR from an external device or an input/output buffer of the semiconductor memory device 100. The address decoder 121 decodes a block address of the received address ADDR. The address decoder 121 selects one or more memory block according to the decoded block address. The address decoder 121 decodes a row address of the received address ADDR. The address decoder 121 selects one of the drain select lines coupled to a selected memory block or one of word lines coupled to a selected memory block according to the decoded row address. The address decoder 121 decodes a column address of the received address ADDR. The address decoder 121 transmits the decoded column address Yi to the read and write circuit 123.

A read operation and a program operation of the semiconductor memory device 100 are performed in the unit of a page. The address ADDR may include a block address, a row address and a column address to perform the read operation or the program operation. The address decoder 121 may select one memory block, one drain select line and one word line according to the address ADDR, and provide the decoded column address Yi to the read and write circuit 123.

An erase operation of the semiconductor memory device 100 is performed in the unit of a memory block. The address ADDR may include a block address to perform the erase operation. The address decoder 121 may select one memory block according to the address ADDR.

The address decoder 121 may include a block decoder, a row decoder, a column decoder and an address buffer, etc.

The voltage generator 122 generates voltages using an external voltage supplied to the semiconductor memory device 100 in response to a controlling signal from the control logic 124. The voltages generated from the voltage generator 122 are used as voltages supplied to the memory cell array 110. According to some embodiments, the voltage generator 122 may include a circuit for generating a supply voltage by regulating the external voltage. The voltage generator 122 may include pumping capacitors, and generate voltages by activating selectively the pumping capacitors. The generated voltages are supplied to the address decoder 121.

The read and write circuit 123 is coupled to the memory cell array 110 through the bit lines BL. The read and write circuit 123 operates in response to control of the control logic 124. In the program operation and the read operation, the read and write circuit 123 exchanges data DATA with an external device or an input/output buffer (not shown) of the semiconductor memory device 100. In the program operation, the read and write circuit 123 receives the data DATA to be programmed. The read and write circuit 123 delivers the received data DATA to bit lines representing the decoded column address Yi of the bit lines BL. The delivered data DATA is programmed to selected memory cells. In the read operation, the read and write circuit 123 reads data from the selected memory cells through bit lines representing the decoded column address Yi of the bit lines BL, and outputs the read data DATA. In the erase operation, the read and write circuit 123 may float the bit lines BL. According to some embodiments, the read and write circuit 123 may include page buffers (or page registers), a column select circuit, etc.

The control logic 124 is coupled to the address decoder 121, the voltage generator 122 and the read and write circuit 123. The control logic 124 receives a control signal CTRL from the external device or the input/output buffer of the semiconductor memory device 100. The control logic 124 controls operation of the semiconductor memory device 100 in response to the control signal CTRL.

According to some embodiments, the semiconductor memory device 100 may also include an input/output buffer (not shown). The input/output buffer may receive the control signal CTRL and the address ADDR from the external device, and provide the received control signal CTRL and the address ADDR to the control logic 124 and the address decoder 121, respectively. The input/output buffer may deliver the data DATA received from the external device to the read and write circuit 123, and deliver the data DATA of the read and write circuit 123 to an external device.

Consistent with some embodiments, the peripheral circuit 120 sets channels of the cell strings included in the selected memory block before the program operation is performed. For example, a potential of the channel of each of the cell strings may decrease as a distance between the channel and a common source line becomes smaller. Consistent with some embodiments, the semiconductor memory device 100 may be a non-volatile memory device, such as a flash memory device.

Figure 2:
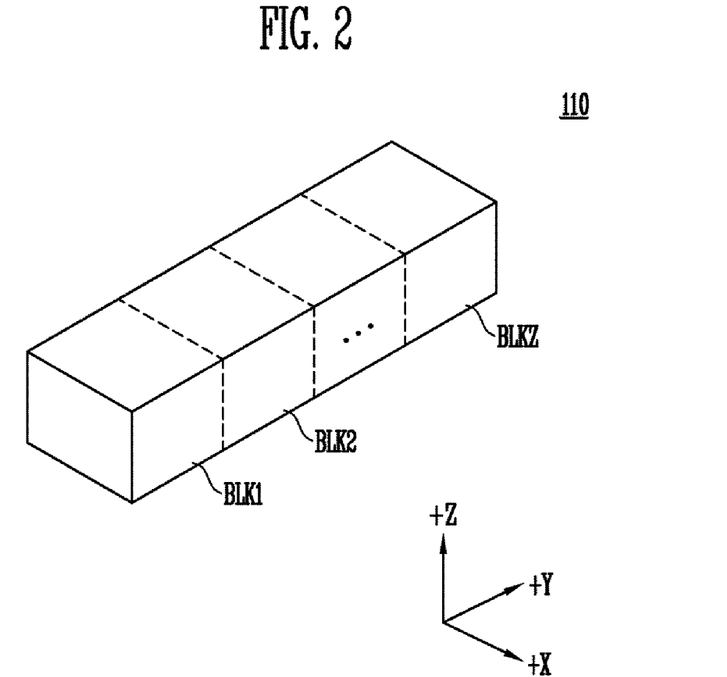
FIG. 2 is a block diagram illustrating the memory cell array in FIG. 1.

FIG. 2 is a block diagram illustrating the memory cell array in FIG. 1. A shown in FIG. 2, the memory cell array 110 may include memory blocks BLK1~BLKz. Each of the memory blocks may have a three-dimensional structure, such that each of the memory blocks includes structures extended in an X-axis direction, an Y-axis direction and a Z-axis direction. Each of the memory blocks may include cell strings disposed in the Y-axis direction and the Z-axis direction. Each of the cell strings is a structure extended in the Z-axis direction. The structure of each of the memory blocks will be described in detail with reference to accompanying drawings FIG. 3 to FIG. 7.

Figure 3:
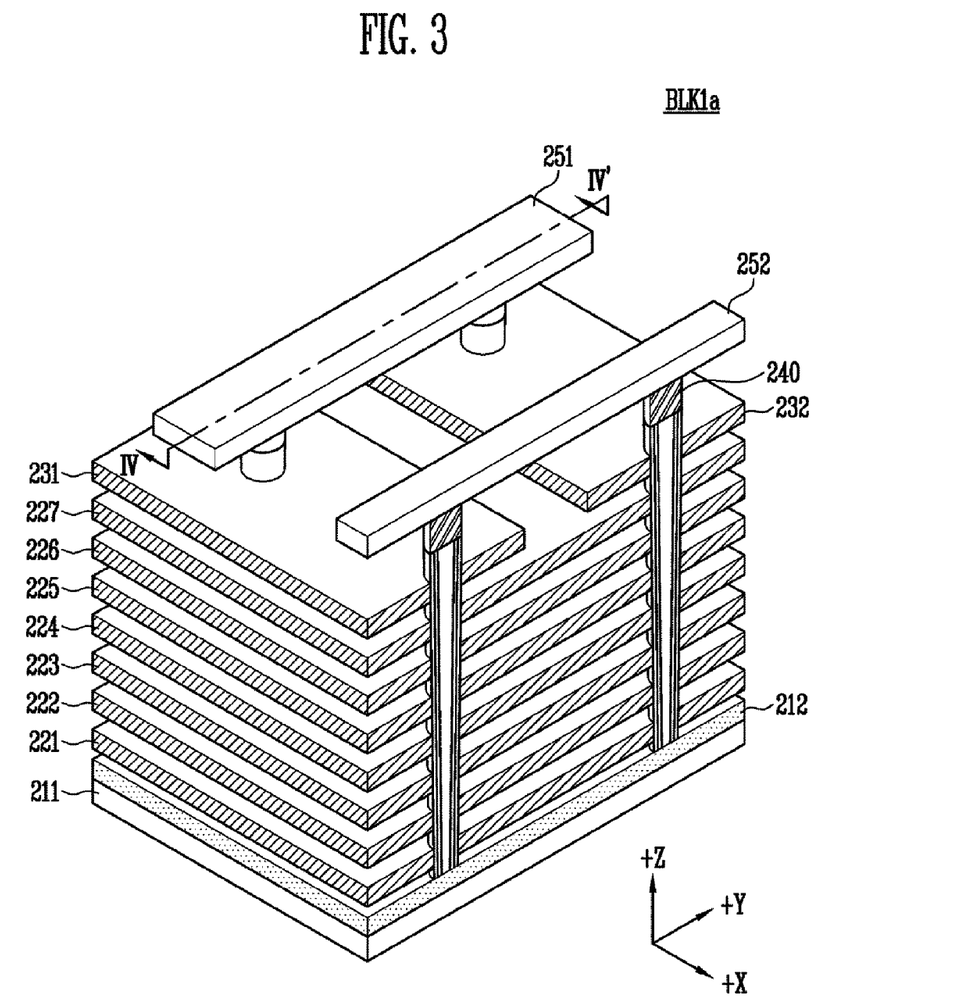
FIG. 3 is a perspective view illustrating an example BLK1a of one BLK1 in the memory blocks BLK1~BLKz in FIG. 2.
Figure 4:
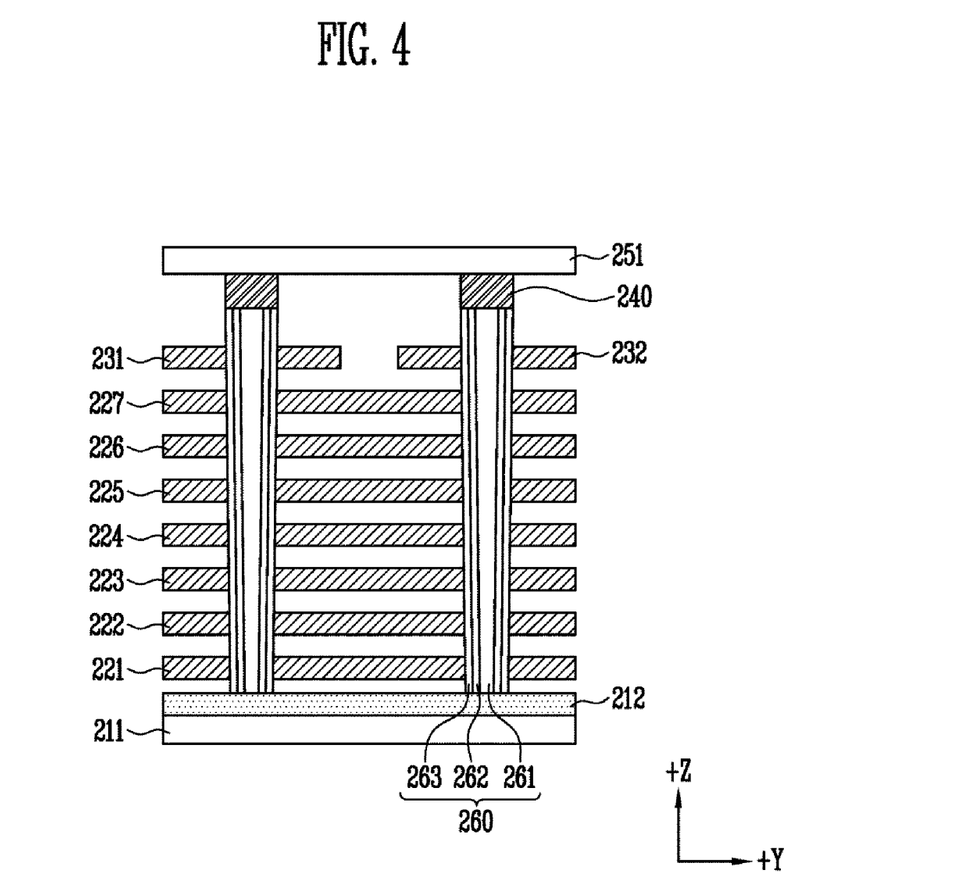
FIG. 4 is a sectional view illustrating the memory block BLK1a taken along a line of IV-IV' in FIG. 3.

FIG. 3 is a perspective view illustrating an example BLK1a of one of the memory blocks BLK1~BLKz in FIG. 2. FIG. 4 is a sectional view illustrating the memory block BLK1a taken along a line of IV-IV' in FIG. 3. In FIG. 3 and FIG. 4, a second-type (e.g. n-type) doping area 212 may be disposed on a first-type (e.g. p-type) substrate 211. The substrate 211 may be provided as a pocket p-well in an n-well.

A first to a seventh conductive material layers 221 to 227 are disposed above the doping area 212 in the z-axis direction. Each of the first to the seventh conductive material layers 221 to 227 is extended in the X-axis direction and the Y-axis direction. Eighth conductive material layers 231 and 232 are disposed above the seventh conductive material layer 227 in the z-axis direction. The eighth conductive material layers 231 and 232 are spaced from each other in the Y-axis direction. In an embodiment, the first to the seventh conductive material layers 221 to 227 and the eighth conductive material layers 231 and 232 may be made from poly silicon. Insulating material layers (not shown) may be formed among the first to the seventh conductive material layers 221 to 227 and the eighth conductive material layers 231 and 232. The insulating material layers may include for example silicon oxide.

Consistent with some embodiments, each of the first to the seventh conductive material layers 221 to 227 has a first to a seventh height, and the eighth conductive materials 232 and 232 have an eighth height.

Pillars 260 may be formed through the first to the seventh conductive material layers 221 to 227 and the eighth conductive material layers 231 and 232, the pillars being spaced apart from one another in the X-axis direction and the Y-axis direction. Each of the pillars 260 is extended in the Z-axis direction. In an embodiment, a width of each of the pillars 260 in the X-axis direction and the Y-axis direction may be tapered such that the width reduces as a distance between the pillars 260 and the substrate 211 becomes smaller.

Each of the pillars 260 may include an internal material layer 261, a middle layer 262 and a surface layer 263. The internal material layer 261 includes insulating material. For example, the internal material layer 261 may include silicon oxide or air gap. The middle layer 262 may include silicon material doped with the first impurity type. The middle layer 262 operates as a channel (C in FIG. 11 and FIG. 12) in the Z-axis direction. The surface layer 263 stores data. For example, the surface layer 263 includes a tunnel insulating layer, an electric charge storage layer and a blocking insulating layer disposed in sequence on the middle layer 263.

Consistent with some embodiments, the tunnel insulating layer may include a thermal oxide layer. The electric charge storage layer may include a nitride layer or a metal oxide layer. The blocking insulating layer may include a dielectric layer having dielectric constant higher than dielectric constants of the tunnel insulating layer and the electric charge storage layer.

Drains 240 may be formed on the pillars 260. Each of the drains 240 may include for example silicon material doped with a second impurity type. Upper conductive material layers 251 and 252 extended in, for example, the Y-axis direction and are formed on the drains 240. The upper conductive material layers 251 and 252 are spaced apar from each other in the X-axis direction. Consistent with some embodiments, the upper conductive material layers 251 and 252 may be metal. The upper conductive material layers 251 and 252 may be made of poly silicon.

The pillars 260 and the conductive material layer (for example, 225) adjacent to the pillars 260 may operate as one cell transistor. That is, the middle layer 263 of the pillar 260 operating as a channel, the tunnel insulating layer, the electric charge storage layer and the blocking insulating layer of the surface layer 263 of the pillar 260, and the conductive material layer operating as a control gate may form one cell transistor.

Each of the pillars 260 contacts with one of the conductive material layers 221 to 227 having the first to the seventh heights and the eighth conductive material layers 231 and 232 having the eighth height. Accordingly, one pillar 260 corresponds to eight cell transistors. If one pillar 260 corresponds to one cell string, each of the cell strings may include a first cell transistor to an eighth cell transistor.

Eight conductive material layers 221~227, 231 and 232 are shown in FIG. 3 and FIG. 4. However, consistent with some embodiments nine or more conductive material layers or seven or less conductive material layers may be used. In FIG. 3 and FIG. 4, two pillars are coupled to one bit line, e.g. 252. However, three or more pillars may be coupled to one bit line. Two bit lines 251 and 252 are shown in FIG. 3 and FIG. 4. However, the memory block may include three or more bit lines. That is, One bit line may be coupled to M pillars, M being a positive integer. N bit lines are provided, N being a positive integer.

Figure 5:
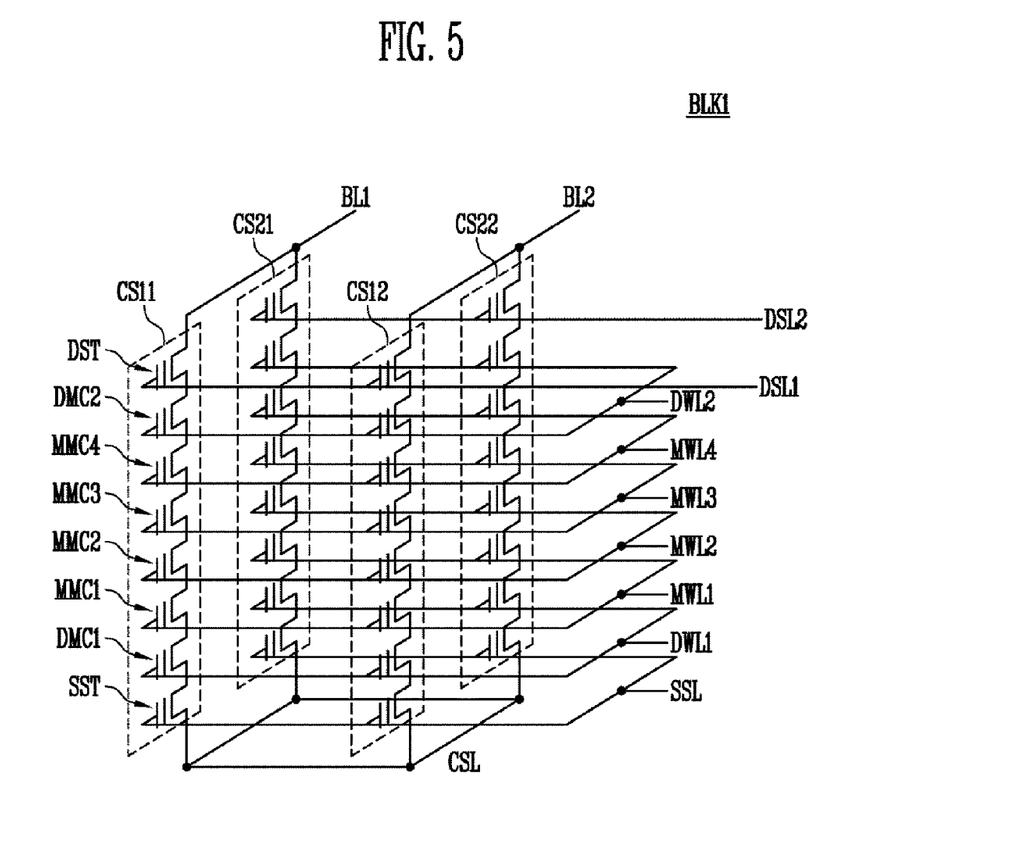
FIG. 5 is a view illustrating equivalent circuit of the memory block in FIG. 3 and FIG. 4.

FIG. 5 is a view illustrating equivalent circuit of the memory block in FIG. 3 and FIG. 4. In FIG. 3 to FIG. 5, the second-impurity type doping area 212 may operate as a common source line CSL. The first conductive material layer 221 having first height may operate as a source select line SSL. The second conductive material layer 222 having a second height may operate as a first dummy word line DWL1. The third to the sixth conductive material layers 223 to 226 having a third height to a sixth height may operate as a first to a fourth main word lines MWL1 to MWL4, respectively. The seventh conductive material layer 227 having the seventh height may operate as a second dummy word line DWL2. The eighth conductive material layers 231 and 232 having the eighth height may operate as a first drain select line DSL1 and a second drain select line DSL2, respectively. The first and the second upper conductive material layers 251 and 252 may operate as a first bit line BL1 and a second bit line BL2, respectively.

As shown in FIG. 3 and FIG. 4, each of the pillars 260 corresponds to one cell string CS. Since four pillars are shown in FIG. 3, the memory block BLK1 includes four cell strings CS11, CS12, CS21 and CS22. Hereinafter, the cell strings CS11, CS12, CS21 and CS22 are defined in the unit of row and column. The cell strings coupled in common to one bit line are defined as one column. The cell strings CS11 and CS21 coupled to the first bit line BL1 correspond to a first column. The cell strings CS12 and CS22 coupled to the second bit line BL2 correspond to a second column.

The cell strings coupled to one drain select line are defined as one row. The cell strings CS11 and CS12 coupled to the first drain select line DSL1 correspond to a first row. The cell strings CS21 and CS22 coupled to the second drain select line DSL2 correspond to a second row.

As shown in FIG. 3 and FIG. 4, each of the cell strings CS includes the cell transistors having the first to the eight heights. The cell transistor having the first height in each of the cell strings CS operates as a source select transistor SST. The cell transistor having the second height in each of the cell strings CS operates as a first dummy memory cell DMC1. The cell transistors having the third to the sixth heights in each of the cell strings CS operate as a first to a fourth main memory cells MMC1 to MMC4. The cell string having the seventh height in each of the cell strings CS operates as a second dummy memory cell DMC2. The cell transistor having the eighth height in each of the cell strings CS operates as a drain select transistor DST. The select transistors SST and DST, the dummy memory cells DMC1 and DMC2 and the main memory cells MMC1 to MMC4 may have substantially the same structure.

Memory cells which correspond to one row and have the same height form one page. For example, memory cells in the cell strings CS11 and CS12 of the memory cells having the third height form one page, and memory cells in the cell strings CS21 and CS22 of the memory cells having third height form another page.

The source select transistors SST in the cell strings CS are coupled in common to the source select line SSL.

The memory cells having substantially the same height are coupled in common to one word line. Here, the memory cell means the dummy memory cell DMC or the main memory cell MMC, and the word line indicates a dummy word line DWL or a main word line MWL. The first dummy memory cell DMC1 of each of the cell strings CS is coupled to the first dummy word line DWL1. The first to the fourth main memory cells MMC1 to MMC4 in each of the cell strings CS are coupled to the first to the fourth main word lines MWL1 to MWL4, respectively. The second dummy memory cell DMC2 in each of the cell strings CS is coupled to the second dummy word line DWL2.

The cell strings in different rows are coupled to different drain select lines DSL. The drain select transistor DST in each of the cell strings CS11 and CS12 in the first row is coupled to the first drain select line DSL1. The drain select transistor DST in each of the cell strings CS21 and CS22 in the second row is coupled to the second drain select line DSL2.

The drain select lines DSL1 and DSL2 may be selected or not be selected. The cell strings, e.g. CS21 and CS22 coupled to the drain select line, e.g. DSL2 which is not selected are separated electrically from corresponding bit line, and the cell strings, e.g. CS11 and CS12 coupled to the selected drain select line, e.g. DSL1 are connected electrically to corresponding bit line.

As discussed previously, consistent with some embodiments, a program operation and a read operation are performed in the unit of a page. In the program operation and the read operation, one of the drain select lines DSL1 and DSL2 is selected, and one main word line is selected. Accordingly, the memory cells coupled to the selected main word line among the cell strings, e.g. CS11 and CS12 coupled to the selected drain select line, e.g. DSL1 will be accessed at a time.

Figure 6:
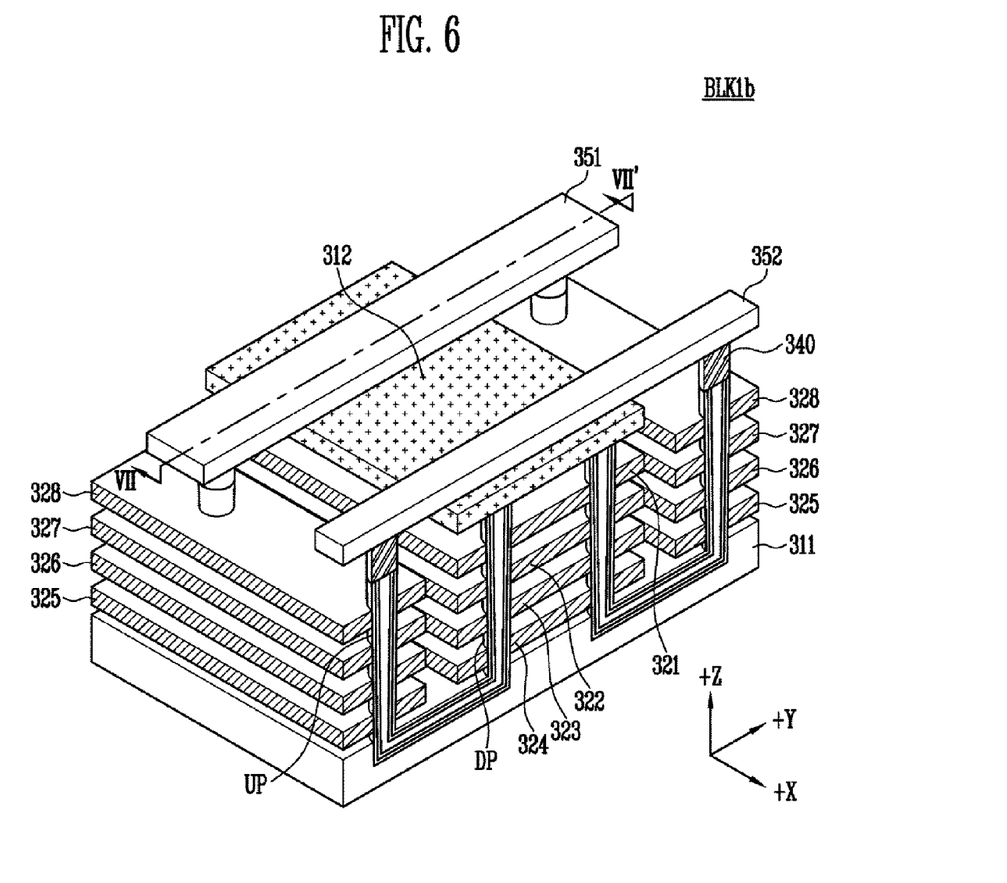
FIG. 6 is a perspective view illustrating one of the memory blocks in FIG. 2 according to some embodiments.
Figure 7:
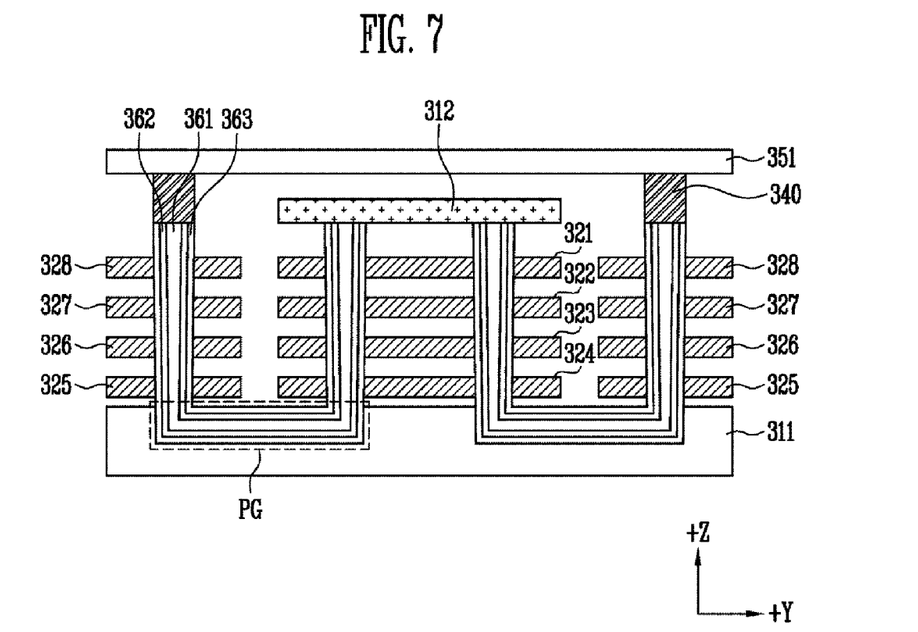
FIG. 7 is a sectional view illustrating a memory block taken along the line VII-VII' in FIG. 6.

FIG. 6 is a perspective view illustrating one of the memory blocks in FIG. 2 according to some embodiments. FIG. 7 is a sectional view illustrating a memory block taken along the line VII-VII' in FIG. 6.

Referring to FIG. 6 and FIG. 7, a first to a fourth conductive material layers 321 to 324 may be disposed on a substrate 311. Consistent with some embodiments, the first to fourth conductive material layers 321 to 324 may extend in an X-axis direction and an Y-axis direction. The first to the fourth conductive material layers 321 to 324 are spaced from one another in a Z-axis direction.

Fifth to eighth conductive material layers 325 to 328 may be disposed on the substrate 311. Consistent with some embodiment, fifth to eighth conductive material layers 325 to 328 may extend in the X-axis direction and the Y-axis direction. The fifth to the eight conductive material layers 325 to 328 are spaced from one another in a Z-axis direction. The fifth to the eighth conductive material layers 325 to 328 are spaced from the first to the fourth conductive material layers 321 to 324 in the Y-axis direction.

Lower pillars may be formed through the first to the fourth conductive material layers 321 to 324. Each of the lower pillars DP is extended in the Z-axis direction. Upper pillars may be formed through the fifth to the eighth conductive material layers 325 to 328. Each of the upper pillars UP is extended in the Z-axis direction.

Each of the lower pillars DP and the upper pillars UP may include an internal material layer 361, a middle layer 362 and a surface layer 363. In the same manner in FIG. 3 and FIG. 4, the middle layer 362 may operate as a channel of the cell transistor. The surface layer 363 may include a blocking insulating layer, an electric charge storage layer and a tunnel insulating layer.

The lower pillar DP and the upper pillar UP may be coupled through a pipe gate PG. The pipe gate PG may be formed in the substrate 311. Consistent with some embodiments, the pipe gate PG may include substantially the same material as the lower pillar DP and the upper pillar UP.

A doping material layer 312 with a second impurity type may be disposed on the lower pillar DP, the doping material layer 312 extending in the X-axis direction and the Y-axis direction. For example, the second impuritytype doping material layer 312 may include n-type silicon material. The second impuritytype doping material layer 312 may operate as the common source line (CSL in FIG. 5).

Drains 340 may be formed on each of the upper pillars UP. For example, the drain 340 may include n-type silicon material. A first and a second upper conductive material layers 351 and 352 may be formed on the drains 340, they being extended in the Y-axis direction. The first and the second upper conductive material layers 351 and 352 are spaced apart from each other in the X-axis direction. For example, the first and the second upper conductive material layers 351 and 352 may be made up of metal. Consistent with some embodiments, the first and the second upper conductive material layers 351 and 352 may be coupled to drains 340 through contact plugs. The first and the second upper conductive material layers 351 and 352 may operate as first and a second bit lines (BL1 and BL2 in FIG. 5), respectively.

The first conductive material layer 321 may operate as the source select line (SSL in FIG. 5), and the second conductive material layer 322 may operate as the first dummy word line (DWL1 in FIG. 5), and the third and the fourth conductive material layers 323 and 324 may operate as the first and the second main word lines (MWL1, MWL2 in FIG. 5), respectively. The fifth and the sixth conductive material layers 325 and 326 may operate respectively as the third and the fourth main word lines (MWL3, MWL4 in FIG. 5), the seventh conductive material layer 327 may operates as the second dummy word line (DWL2 in FIG. 5), and the eighth conductive material layer 328 may operate as the drain select line (DSL in FIG. 5).

The lower pillar DP and the first to the fourth conductive material layers 321 to 324 adjacent to the lower pillar DP form a lower string. The upper pillar UP and the fifth to the eighth conductive material layers 325 to 328 adjacent to the upper pillar UP form an upper string. The lower string and the upper string are coupled through the pipe gate PG. One terminal of the lower string is coupled to the second-type doping material layer 312 operating as the common source line CSL. One terminal of the upper string is coupled to a corresponding bit line through the drain 320. The lower string and the upper string are coupled through the pipe gate PG. One lower string and one upper string may form one cell string coupled between the second-type doping material layer 312 and corresponding bit line.

Consequently, the memory block BLK1b may have equivalent circuit as shown in FIG. 5. That is, the lower string may include a source select transistor SST, the first dummy memory cell DMC1, and a first and a second main memory cells MMC1 and MMC2. The upper string may include a third and a fourth main memory cells MMC3 and MMC4, the second dummy memory cell DMC2 and a drain select transistor DST.

Embodiments of the three-dimensional memory cell array are described in detail with reference to FIG. 3 to FIG. 7. However, the structure of the three-dimensional memory cell array may be variously modified. The structure of the memory block BLK1 may be various modified as long as it has substantially the equivalent circuit in FIG. 5.

Figure 8:
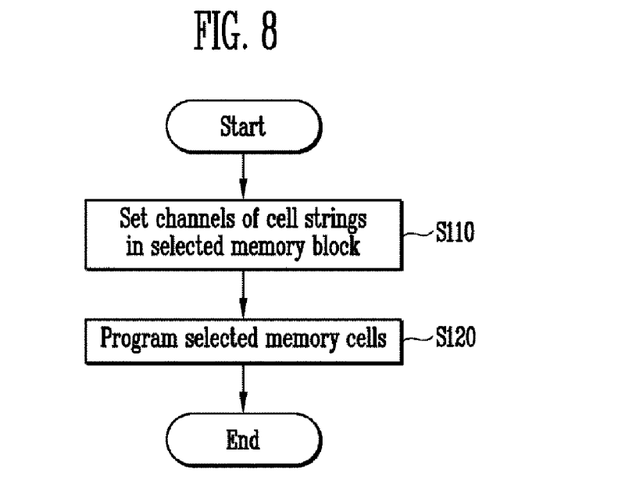
FIG. 8 is a flowchart illustrating operation of a semiconductor memory device according to some embodiments.

FIG. 8 is a flowchart illustrating operation of a semiconductor memory device according to some embodiments. For the purpose of illustration, the flowchart shown in FIG. 8 will be discussed with respect to FIGS. 1-7. In FIG. 5 and FIG. 8, channels of the cell strings CS11, CS12, CS21 and CS22 included in a selected memory block BLK1 are set in step S110. A negative voltage may be supplied to one or more of the word lines DWL1, DWL2, MWL1~MWL4 coupled to the selected memory block BLK1, and a supply voltage having positive level may be supplied to the common source line CSL. Here, a reference voltage, e.g. a ground voltage may be supplied to the bit lines BL1 and BL2, and the supply voltage may be supplied to the drain select lines DSL1 and DSL2. As a result, electrons remaining in the channels of the cell strings CS11, CS12, CS21 and CS22 are discharged to the common source line CSL.

In step S120, selected memory cells in the selected memory block BLK1 are programmed. In the program operation, the supply voltage is supplied to one of the drain select lines DSL1 and DSL2, and so selected cell strings, e.g. CS11 and CS12 are electrically connected to the bit lines BL1 and BL2. The reference voltage or negative voltage is supplied to the other drain select line, e.g. DSL2, and thus cell strings not selected, e.g. CS21 and CS22 are electrically separated from the bit lines BL1 and BL2. That is, the cell strings not selected, e.g. CS21 and CS22 are floated. Memory cells coupled to a selected main word line of the selected cell strings may be programmed.

Since channels of the cell strings not selected are floated, they are boosted by high voltages supplied to the word lines DWL1, DWL2, MWL1~MWL4. That is, memory cells in the cell strings not selected are not programmed.

It is assumed that many electrons remain in the channels of the cell string not selected. The remaining electrons may interrupt boosting of the channel of corresponding cell string when high voltages are supplied to the word lines DWL1, DWL2, MWL1~MWL4. For example, current may leak out from the bit lines BL1 and BL2 to the channels of the cell strings not selected due to the remaining electrons, or leak out from the channel of the cell string not selected to the bit lines BL1 and BL2. The boosting of the channels of the cell string not selected may not be normally performed, and thus the memory cells in the cell string not selected may be unintentionally programmed.

Consistent with some embodiments, electrons remaining in the channels of the cell strings CS11, CS12, CS21 and CS22 are discharged before the program operation is performed. Accordingly, the channels of the cell strings not selected are normally boosted in the program operation. As a result, reliability of the program operation may be enhanced.

Figure 9:
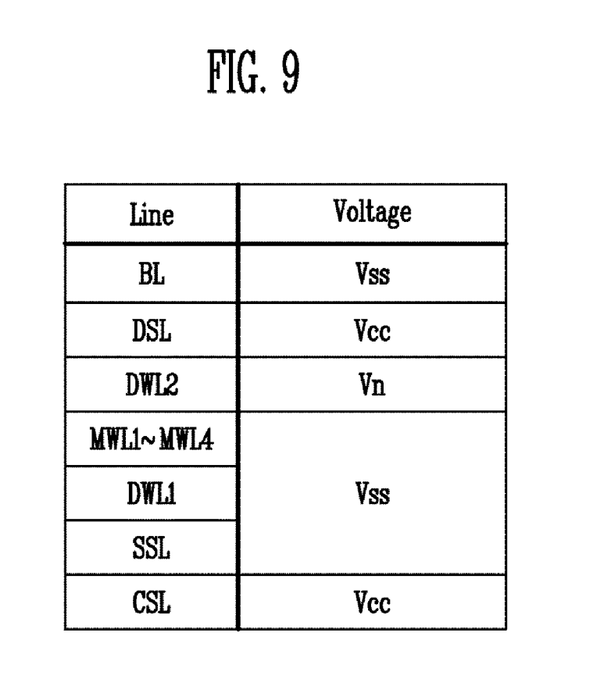
FIG. 9 is a view illustrating a table showing voltages supplied to cell strings when the step S110 is performed in FIG. 8.

FIG. 9 is a view illustrating a table showing voltages supplied to cell strings when the step S110 is performed in FIG. 8. In FIG. 5 and FIG. 9, a supply voltage Vcc is supplied to the common source line CSL. A reference voltage Vss is supplied to the source select line SSL, the first dummy word line DWL1 and the first to the fourth main word lines MWL1 to MWL4. A negative voltage is supplied to the second dummy word line DWL2 adjacent to the drain select lines DSL1 and DSL2. The supply voltage Vcc is supplied to the drain select lines DSL1 and DSL2, and the reference voltage Vss is supplied to the bit lines BL1 and BL2.

Figure 10:
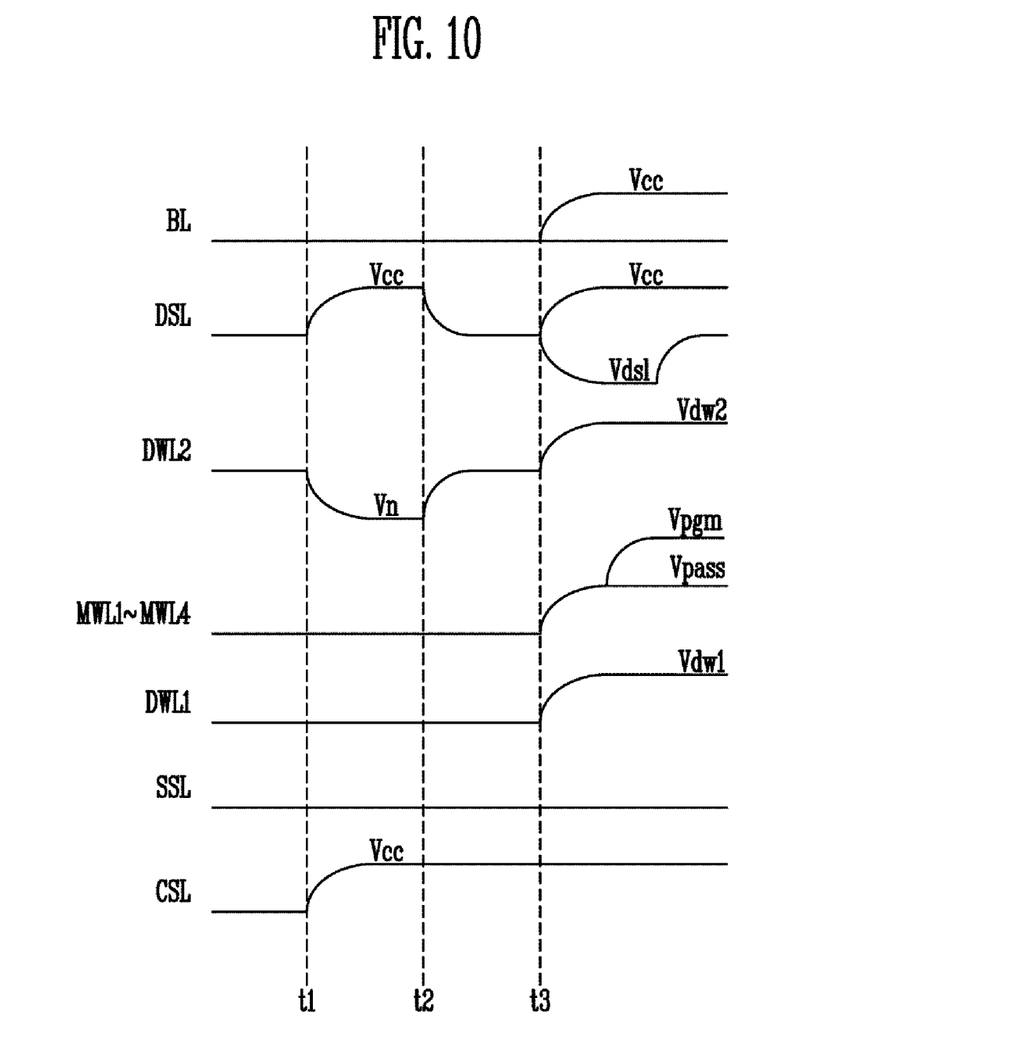
FIG. 10 is a timing diagram illustrating voltages supplied to cell strings CS11, CS12, CS21 and CS22 of a selected memory block.
Figure 11:
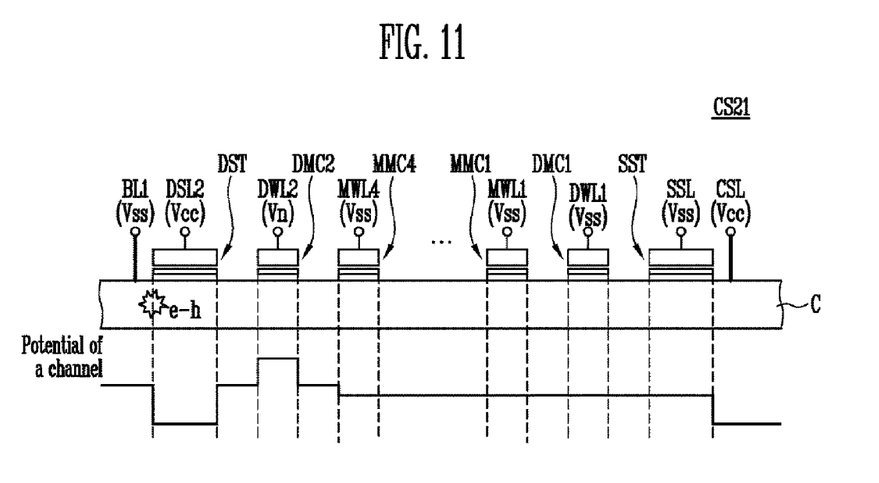
FIG. 11 is a view illustrating conceptually channel potential of one of the cell strings CS11, CS12, CS21 and CS22 when the step S110 in FIG. 8 is performed.
Figure 12:
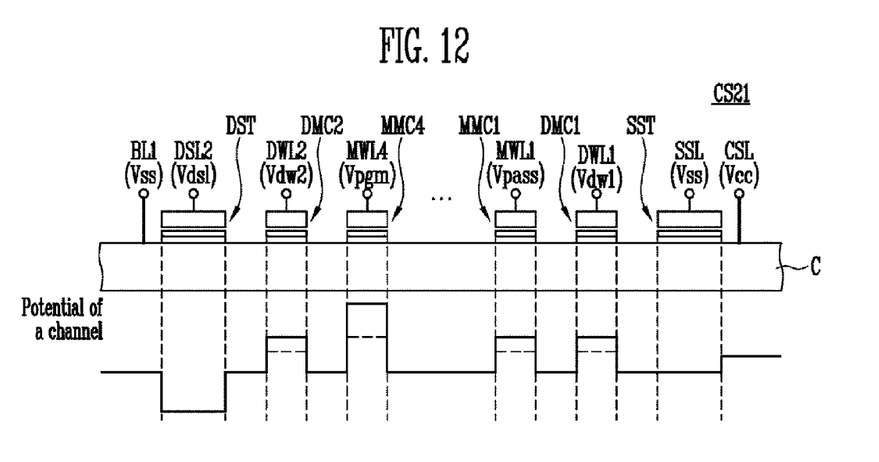
FIG. 12 is a view illustrating conceptually channel potential of a cell string not selected when the step S120 in FIG. 8 is performed.

FIG. 10 is a timing diagram illustrating voltages supplied to cell strings CS11, CS12, CS21 and CS22 of a selected memory block. FIG. 11 is a view illustrating a channel potential of one of the cell strings CS11, CS12, CS21 and CS22 when the step S110 in FIG. 8 is performed. FIG. 12 is a view illustrating a channel potential of a cell string not selected when the step S120 in FIG. 8 is performed.

In FIG. 10, the interval between a first time t1 and a second time t2 corresponds to setting operation for channels of the cell strings CS11, CS12, CS21 and CS22. The interval between the second time t2 and a third time t3 corresponds to a middle operation where the setting operation is finished and a program operation is prepared. The interval after the third time t3 corresponds to the program operation.

In FIG. 5 and FIG. 10, the supply voltage Vcc is supplied to the common source line CSL at the first time t1. The reference voltage Vss supplied to the source select line SSL, the first dummy word line DWL1 and the first to the fourth main word lines MWL1 to MWL4 is maintained. The negative voltage Vn is supplied to the second dummy word line DWL2. The supply voltage Vcc is supplied to the drain select lines DSL1 and DSL2. The bit lines BL1 and BL2 may be electrically connected to the cell strings CS11, CS12, CS21 and CS22. That is, the cell strings CS11, CS12, CS21 and CS22 are not floating. The reference voltage Vss is supplied to the bit lines BL1 and BL2.

In FIG. 11, electron-hole pairs, e-h are generated in a channel C of the cell string CS21 by difference of the reference voltage Vss supplied to the first bit line BL1 and the supply voltage Vcc supplied to the second drain select line DSL2. The generated holes h shift to a channel corresponding to a second dummy memory cell DMC2 to which the negative voltage Vn is supplied. The generated electrons e are discharged to the common source line CSL to which the supply voltage Vcc is supplied. Accordingly, potential of the channel corresponding to the second dummy memory cell DMC2 is highest among potentials of every channel C of the cell string CS21, and potential of the channel corresponding to the common source line CSL is lowest among the potentials of every channel C of the cell string CS21. The potentials of the channels corresponding to the source select transistor SST, the first dummy memory cell DMC1 and the main memory cells MMC1 to MMC4 may have substantially the same magnitude or become lower according as distance between the channel and the common source line CSL becomes smaller.

Now referring to FIG. 5 and FIG. 10, voltages supplied to the common source line CSL, the source select line SSL, the first dummy word line DWL1, the first to the fourth main word lines MWL1 to MWL4, the first and the second bit lines BL1 and BL2 are maintained at the second time t2. Voltages supplied to the second dummy word line DWL2 and the first and the second drain select lines DSL1 and DSL2 are changed into the supply voltage.

The program operation starts at the third time t3. A first and a second dummy word line voltages Vdw1 and Vdw2 are supplied to the first and the second dummy word lines DWL1 and DWL2, respectively. A pass voltage Vpass is supplied to the main word lines not selected, e.g. MWL1 to MWL3 of the first to the fourth main word lines MWL1 to MWL4. A program voltage Vpgm is supplied to the selected main word line, e.g. MWL4. Consistent with some embodiments, the program voltage Vpgm may increase and reach the pass voltage Vpass, and then increase further to reach a target voltage. Consistent with some embodiments, the first and the second dummy word line voltages Vdw1 and Vdw2 may be substantially the same as the pass voltage Vpass.

The supply voltage Vcc is supplied to a drain select line, e.g. DSL1 selected from the drain select lines DSL1 and DSL2, and the selected cell strings, e.g. CS11 and CS12 are electrically connected to the bit lines BL1 and BL2. A drain select line voltage Vdsl, which is negative voltage, may be supplied to a drain select line not selected, e.g. DSL2. Leakage current between the cell strings not selected, e.g. CS21 and CS22 and the bit lines BL1 and BL2 may reduce accordingly as the negative voltage is supplied to the drain select line not selected. A voltage of the drain select line not selected may be changed to the supply voltage after the drain select line voltage Vdsl are supplied for certain time of period.

The bit lines BL1 and BL2 may be driven with the supply voltage Vcc or the reference voltage Vss in accordance with data to be stored in selected memory cells.

When the cell string CS21 is not selected, the channel C of the cell string CS21 is floating. In FIG. 12, potential of a channel corresponding to the drain select transistor DST reduces in the event that the drain select line voltage Vdsl having negative voltage is supplied to the second drain select line DSL2. Potentials of channels corresponding to the memory cells DMC1, DMC2, MMC1 to MMC4 are highly boosted as shown in a solid line in FIG. 12 by high voltages supplied to the word lines DWL1, DWL2, MWL1 to MWL4. If electrons remaining in the channel of the cell string CS21 are not discharged before the program operation is performed, the potentials of the channels corresponding to the memory cells DMC1, DMC2, MMC1 to MMC4 may be low-boosted as shown in the solid line.

Figure 13:
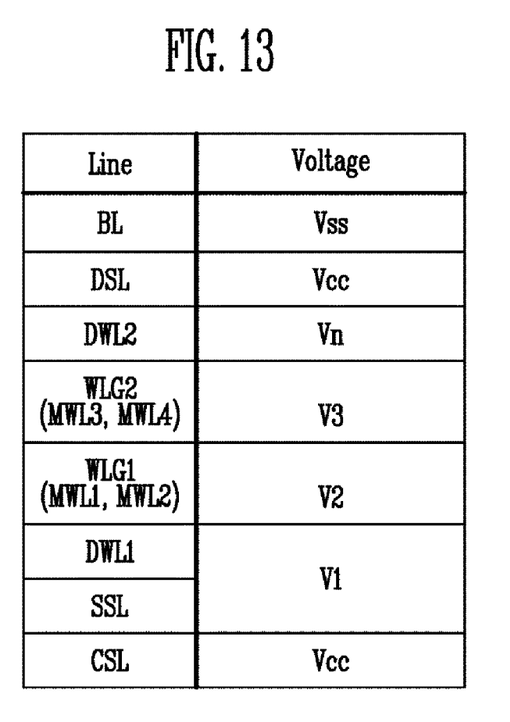
FIG. 13 is a view illustrating a table showing voltages supplied to the cell strings CS11, CS12, CS21 and CS22 when the step S110 in FIG. 8 is performed according to some embodiments.

FIG. 13 is a view illustrating a table showing voltages supplied to the cell strings CS11, CS12, CS21 and CS22 when the step S110 in FIG. 8 is performed according to some embodiments. The voltages supplied to the cell strings CS11, CS12, CS21 and CS22 are substantially the same as in the table in FIG. 9. However, voltages supplied to the lines SSL, DWL1, MWL1 to MWL4 between the common source line CSL and the second dummy word line DWL2 are different from those in the table in FIG. 9. Hereinafter, any further description concerning the same voltages will be omitted.

In FIG. 13, a first voltage is supplied to the source select line CSL and the first dummy word line DWL1. The first to the fourth main word lines MWL1 to MWL4 are divided into word line groups WLG1 and WLG2. One word line group includes one or more main word lines. Consistent with some embodiments, one word line group may include two main word lines. The first word line group WLG1 includes a first main word line MWL1 and a second main word line MWL2. The second word line group WLG2 includes a third main word line MWL3 and a fourth main word line MWL4. A second voltage and a third voltage are supplied to the first and the second word line groups WLG1 and WLG2, respectively.

The first voltage is higher than the second voltage. The second voltage is higher than the third voltage. That is, the lines SSL, DWL1, MWL1 to MWL4 between the common source line CSL and the second dummy word line DWL2 may be divided into groups, and voltages supplied to the word lines get higher according as distance between the groups and the common source line CSL becomes smaller. Accordingly, potential of the channel of each of the cell strings CS11, CS12, CS21 and CS22 gets lower according as distance between the channel and the common source line CSL becomes smaller.

Consistent with some embodiments, electrons remaining in the channels of the cell strings are discharged before the program operation is performed. Accordingly, the channels of the cell strings not selected may be normally boosted when the program operation is performed. As a result, reliability of the program operation may be enhanced.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a three-dimensional semiconductor memory device having cell strings coupled between bit lines and a common source line and formed on or above a substrate, the method comprising:
    setting channels of the cell strings by driving row lines coupled to the cell strings so that a potential of a channel of each of the cell strings has substantially the same magnitude or decreases as a distance between the channel and the substrate becomes smaller; and
    after setting the channels, performing a program operation to a selected area of the cell strings by starting to apply a program voltage and a pass voltage to a selected word line and at least one unselected word line among word lines included in the row lines, respectively.

2. The method of claim 1, wherein
    the setting of the channels comprises:
        supplying a negative voltage to at least one word line of the word lines; and
        supplying a positive voltage to the common source line.

3. The method of claim 2, wherein the at least one word line is disposed between the selected word line and a drain select line connected to the cell strings among the row lines.

4. The method of claim 2, wherein the row lines further include drain select lines and a source select line, and the word lines are disposed between the drain select lines and the source select line,
    and wherein the setting of the channels further comprises:
        supplying a reference voltage to the bit lines; and
        supplying a supply voltage to a selected drain select line among the drain select lines.

5. The method of claim 2, wherein lower word lines, among the word lines, disposed between the at least one word line to which the negative voltage is supplied and a source select line, among the row lines, are divided into word line groups, and wherein voltages supplied to the word line groups increase as a distance between a corresponding word line group and the substrate becomes smaller.

6. A semiconductor memory device comprising:
a memory cell array including cell strings coupled between bit lines and a common source line, and including row lines coupled to the cell strings, each of the cell strings comprising a channel and a plurality of memory cells stacked above a substrate in a direction perpendicular to the substrate; and
a peripheral circuit configured to set the channel of each of the cell strings by driving the row lines coupled to the cell strings so that a potential of the channel of each of the cell strings has substantially the same magnitude or decreases as a distance between the channel and the substrate becomes smaller, and configured to perform a program operation on the cell strings by applying a program voltage and a pass voltage to a selected word line and an unselected word line among word lines among the row lines, respectively,
wherein the peripheral circuit sets the channel before starting to apply the program voltage and the pass voltage.

7. The semiconductor memory device of claim 6, wherein the peripheral circuit sets the channel by supplying a negative voltage to at least one word line of the word lines and a positive voltage to the common source line.

8. The semiconductor memory device of claim 7, wherein the peripheral circuit further supplies the negative voltage to a word line, among the word lines, during the setting of the channel.

9. The semiconductor memory device of claim 7, wherein the row lines further include drain select lines and a source select line, the word lines are disposed between the drain select lines and the source select line,
and wherein the peripheral circuit further supplies a reference voltage to the bit lines and supplies a supply voltage to a selected drain select line among the drain select lines.

10. The semiconductor memory device of claim 7, wherein lower word lines among the word lines disposed between the at least one word line to which the negative voltage is supplied and a source select line are divided into word line groups,
and wherein voltages supplied to the word line groups increase as a distance between a corresponding word line group and the source select line becomes smaller.

11. The method of claim 3, wherein the at least one word line is disposed adjacent to the drain select line.

12. The method of claim 3, wherein the at least one word line is a dummy word line disposed between the selected word line and the drain select line.

13. The semiconductor memory device of claim 7, wherein the at least one word line is disposed between the selected word line and drain select lines.

14. The semiconductor memory device of claim 13, wherein the at least one word line is disposed adjacent to the drain select lines.

15. The semiconductor memory device of claim 7, wherein the at least one word line is a dummy word line disposed between the selected word line and drain select lines.

16. A method of operating a three-dimensional semiconductor memory device having cell strings coupled between bit lines and a common source line, each of the cell strings including first memory cells connected between a bit line and a pipe gate and second memory cells connected between the common source line and the pipe gate, the pipe gate formed on a substrate, the first memory cells and the second memory cells stacked on or above the substrate in a direction perpendicular to the substrate, the method comprising:
setting channels of the cell strings by driving row lines coupled to the cell strings so that a potential of a channel of each of the cell strings has substantially the same magnitude or decreases as a distance between the channel corresponding to the first memory cells and the substrate becomes smaller and as a distance between the channel corresponding to the second memory cells and the substrate becomes greater; and
after setting the channels, performing a program operation to a selected area of the cell strings by starting to apply a program voltage and a pass voltage to a selected word line and at least one unselected word line, among word lines included in the row lines, respectively.

17. The method of claim 16, wherein the setting of the channels comprises:
supplying a negative voltage to at least one word line of the word lines; and
supplying a positive voltage to the common source line.

18. The method of claim 17, wherein the at least one word line is disposed between the selected word line and drain select lines, among the row lines.

19. The method of claim 17, wherein the row lines further include drain select lines and a source select line, and
wherein the setting of the channels further comprises:
supplying a reference voltage to the bit lines; and
supplying a supply voltage to a selected drain select line, among drain select lines.

20. The method of claim 17, wherein the at least one word line is disposed adjacent to drain select lines.

* * * * *